United States Patent [19]

Herndon

[11] Patent Number: 4,713,560
[45] Date of Patent: Dec. 15, 1987

[54] SWITCHED IMPEDANCE EMITTER COUPLED LOGIC GATE

[75] Inventor: William H. Herndon, Sunnyvale, Calif.

[73] Assignee: Fairchild Semiconductor Corporation, Cupertino, Calif.

[21] Appl. No.: 871,639

[22] Filed: Jun. 5, 1986

[51] Int. Cl.$^4$ .................. H03K 3/01; H03K 17/60; H03K 19/086; H03K 19/02

[52] U.S. Cl. .................. 307/455; 307/467; 307/446; 307/570; 307/296 R

[58] Field of Search .......... 307/455, 467, 446, 443, 307/570, 355, 358, 359, 360, 363, 296 R, 561, 475; 323/311, 315-317; 365/226-229

[56] References Cited

U.S. PATENT DOCUMENTS

| | | | |
|---|---|---|---|
| 3,569,746 | 3/1971 | Grenoble et al. | 307/296 |
| 4,551,638 | 11/1985 | Varadarajan | 307/455 |
| 4,585,957 | 4/1986 | Ooms | 307/455 |

Primary Examiner—Stanley D. Miller
Assistant Examiner—Trong Quang Phan
Attorney, Agent, or Firm—Stephen J. Phillips; David H. Carroll; James A. LaBarre

[57] ABSTRACT

There is disclosed herein an ECL gate using switchable load impedance means to allow the gate to be placed in a low power-consumption mode while preserving the logic state existing at the outputs of the gate at the time it is switched into the low-power mode. N-channel or P-channel MOS transistors are used as the switchable load impedances. The gates of these transistors are coupled to a MODE control signal which causes the MOS transistors to switch between high-impedance and low-impedance states. Another MOS transistor having its gate coupled to the same MODE control signal is used as the current source for the bias current to the conventional ECL current mirror. When low-power mode operation is desired, all the MOS transistors are switched to their high-impedance states. This reduces the bias current flowing through the ECL gate, thereby reducing its power consumption. The logic states at the output nodes are preserved by virtue of the load impedance of the ECL switching transistors having increased simultaneously with their collector currents having decreased.

14 Claims, 4 Drawing Figures

I-V CHARACTERISTIC OF A TYPICAL DIODE

SWITCHED IMPEDANCE EMITTER COUPLED LOGIC GATE

BACKGROUND OF THE INVENTION

The invention pertains to ECL gates for use in a variety of applications, and, more particularly, to ECL gates with switchable load impedances.

ECL gates are very popular in logic design because they are current mode logic devices where the bipolar transistors do not saturate. Because the transistors do not saturate, the switching times of such gates are very fast. The price for this increased speed of switching is large power consumption. That is, ECL gates draw large amounts of quiescent collector current even when they are not switching.

In complex computers and large memories, the amount of power an individual gate draws is critical to the overall system, because thousands of such gates are in use. Because of the large number of gates needed and the need for high speeds, the integrated form of gate is preferred for cost reasons and ECL gates are preferred for speed reasons.

ECL is a high speed logic form because saturation is avoided in the switching transistors. Further, the typically low logic swings reduce the charge required to change the voltage level of the various parasitic capacitances in the system. The typically low logic swings still give acceptable noise margins because of the inherently differential nature of ECL which allows first order cancellation of component variables such as Vbe etc. The disadvantage of standard ECL is that the power dissipation is quite high because the d.c. and transient power is the same. In large systems, the available power per gate is limited because the large number of gates require massive, complex and expensive power supplies and cooling equipment. The cooling equipment is required to minimize system and chip temperatures. High chip temperatures degrade component parameters and make it more difficult to keep the transistors out of saturation. High chip temperatures degrade system reliability because of the temperature dependence of several failure modes such as metal migration.

Large systems therefore have power budgets, and the designer must make power versus speed tradeoffs to meet the power budget.

Where power is limited, the capacitances in the ECL circuit cannot be charged and discharged as rapidly as in situations where unlimited current is available. This equates to lower circuit switching speed and lower system performance. Therefore, a need has arisen for an ECL gate which can operate in a high power consumption, high current mode for very rapid switching, but which can be switched to a low power consumption mode when the gate is not actively involved in performing its logic function.

SUMMARY OF THE INVENTION

The invention is an ECL gate which fills the above-mentioned need. The ECL gate of the invention is conventional in most respects, except that it utilizes MOS transistors as switchable load impedances instead of fixed resistances. In the preferred embodiment, these switchable load impedances are MOS transistors which are connected such that the collector current of the bipolar transistors in the ECL gates pass through the channels of these transistors. One transistor is in the collector current path of each bipolar transistor of the differential pair of the typical ECL gate. The gates of these transistors are coupled to a mode control signal on a bus which controls whether the ECL gate is in the high-power mode or the low-power mode. The normal bias current source of the ECL gate current mirror is replaced by another MOS transistor which has the collector current for the first bipolar transistor in the current mirror flowing through its channel. The gate of this MOS transistor is also coupled to the mode control signal bus which carries the signal controlling whether the high-power mode or low-power mode is selected.

When the control signal on the mode control bus connected to the gates of the MOS load transistors causes these transistors to be in their low-impedance state, then current flows freely through the channels of these MOS transistors, and the ECL gate can perform its normal switching activities in a high-power, high-speed mode. When the signal on the mode control bus reverts to its opposite state, the MOS transistors are forced into their high-impedance state. This cuts down the collector current of the first bipolar transistor in the current mirror, and the base emitter voltage drop of this transistor changes to a level to conform with the new, lower collector current from the bias current source. This base emitter voltage drop on the first transistor in the current mirror is applied to the base-emitter junctions of the other transistors of the current mirror, which cause their collector currents to conform to the new, lower collector current level. Thus, the collector current of the bipolar transistor in the shared emitted line of the ECL gate is made substantially smaller. This means that the collector currents of each of the bipolar transistors in the two sides of the ECL gate are substantially smaller, also. If fixed impedance load resistors were used, as in the prior art, the lower collector current in each branch would result in less voltage drop across the load resistors. This would tend to cause both collector output nodes to rise in voltage, thereby destroying the logic state then existing on the ECL gate at the time the gate was powered down. That is, if the bipolar transistor on the left was on and the bipolar transistor on the right was off, then the output coupled to the bipolar transistor on the left would be low, while the output node coupled to the transistor on the right would be high. When the power level is forced to the low power consumption state, the lowered collector currents would cause the low output voltage level to be destroyed because it would rise substantially toward $V_{CC}$.

In contrast, in the invention the load impedances are MOS transistors. Because the same control voltages will cause the MOS transistor acting as the collector load for the current mirror to revert to its high-impedance state is also applied to the gates of the MOS load transistors connected to the collectors of the bipolar transistors of the ECL gate, these transistors also revert to their high-impedance states. The result is that lowered collector currents in each branch of the ECL gate flows through a higher impedance. Therefore, even though the collector current is less, the impedance is greater which results in the voltage drop across the MOS transistors remaining relatively constant compared to the voltage drop across that same transistor in the higher current mode. Ultimately, therefore, the logic state of the ECL gate is preserved in the low-power mode.

DETAILED DESCRIPTION OF THE PREFERRED EMBODIMENT

Figure 1:
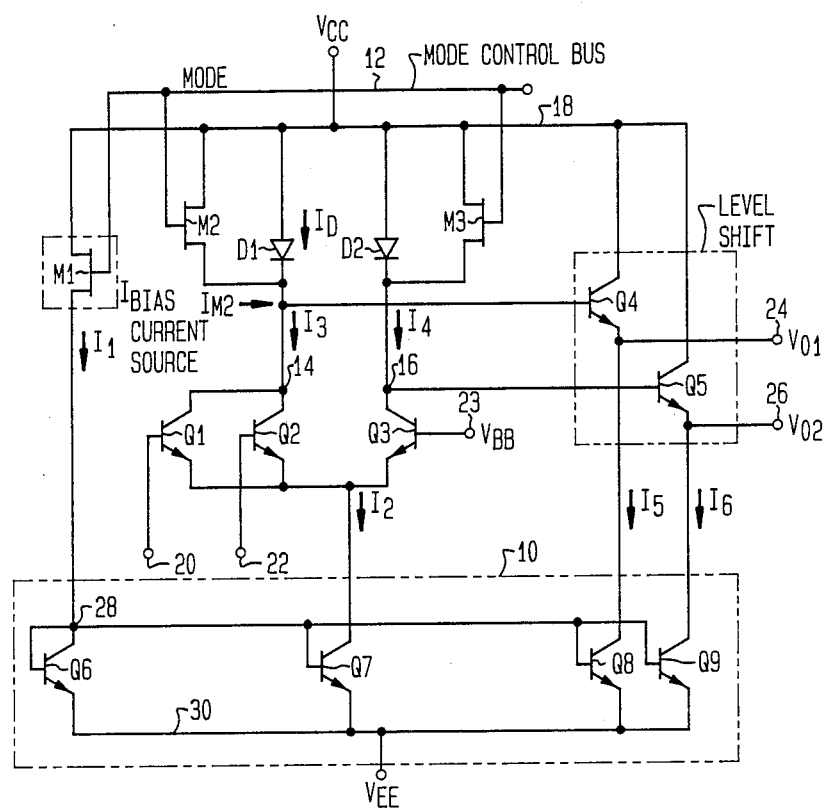
FIG. 1 is a schematic diagram of an ECL gate using the invention.

Referring to FIG. 1, there is shown a schematic diagram of an ECL gate utilizing MOS transistors as switchable load devices. The bipolar switching transistors forming the heart of the ECL gate are the transistors Q1, Q2, and Q3. These transistors have as their load devices the MOS transistors M2 and M3. A third MOS transistor, M1, serves as the load device and switchable current source for the bipolar transistor Q6 of the current mirror 10. The current mirror is comprised of the bipolar transistors Q6, Q7, Q8, and Q9.

The MOS load devices M1 through M3 have their gates coupled to a mode control bus 12 which carries a MODE signal controlling whether the gate is in a high power or a low power mode. Further, each MOS transistor has its source and drain connected such that the collector current of the bipolar transistor for which it is a load impedance flows through the channel thereof. The exact connections for the source and drain regions of each MOS transistor will be specified later in the discussion of use of PMOS or NMOS for these transistors M1-M3.

In the preferred embodiment, the MOS load transistors M2 and M3 also have clamping diodes D1 and D2 coupled between the output nodes 14 and 16 of Q2 and Q3 and the VCC supply bus 18. The purpose of these clamping diodes D1 and D2 is to control the voltage swings on the collector nodes 14 and 16 to within a small range of voltage variation, despite the fact that the matching between the switch current, I2, and the load current available from the transistors M2 and M3 may vary more widely. The transistors M2 and M3 and the switch current I2 are designed so that in both the high and low power states, there is significant clamp current flowing thru the clamp diode connected to the logic low output. (D1 if Q1 or Q2 is on, D2 if Q3 is on). The logic low output high and low power operating points correspond to FIG. 2 points 42 and 44 respectively. In the configuration shown in FIG. 1, the difference between a logic low and a logic high is one diode drop (usually between 0.7 and 0.8 volts). In ECL, the difference between logic low and logic high on nodes 14 and 16 need only be about 0.2 volts.

The logic signal inputs are applied at the nodes 20 and 22, which are coupled to the bases of Q1 and Q2. The base of Q3 is coupled to a voltage supply $V_{BB}$. The voltage $V_{BB}$ is a reference voltage used for ascertaining the logic level of the logic input signals supplied to the nodes 20 and 22. The output nodes of the ECL gate of FIG. 1 are shown at 24 and 26. These output nodes are driven by two emitter followers and level shifters comprised of the transistors Q4 and Q5 having emitter impedances established by transistors Q8 and Q9 in the current mirror 10. The bases of the transistors Q4 and Q5 are coupled to the nodes 14 and 16, respectively.

OPERATION OF THE GATE

In normal operation, the ECL gate of FIG. 1 operates in a high-power mode. In this mode, the mode control bus carries a MODE signal to the gate of each of the transistors M1 through M3 to cause it to assume a low impedance value. The transistors M2 and M3 should have thresholds related to the amplitude of the MODE signal such that the transistors M2 and M3 are turned on sufficiently to represent an impedance of the proper value to cause the switching transistors Q1–Q3 to properly operate at the desired operating point. The proper impedance to make an ECL gate work properly for a given voltage level for reference voltages $V_{CC}$, $V_{BB}$ and $V_{EE}$ are well known to those skilled in the art. Further, those skilled in the art know how to properly construct MOS transistors with proper thresholds and size such that for a given level of the MODE signal, the desired impedance to current flow through the channel of the MOS transistors M2 and M3 may be established and the proper collector current allowed to flow. The MODE signal on mode control bus 12 also causes the transistor M1 to be turned on, and if its threshold and size are the same as for transistors M2 and M3, transistor M1 will have the same channel impedance as exists in transistors M2 and M3. With $V_{CC}$ fixed and a predetermined channel impedance for the transistor M1, a bias current I1 will be established. I1 will be the collector current for the transistor Q6 in the current mirror 10.

The current mirror 10 operates as follows. The bias current I1 forces the base-to-emitter voltage drop of the transistor Q6 to assume a level which corresponds to the collector current level I1 on the collector current characteristic curves for the transistor Q6. Since Q6 has its base connected to it's collector, Q6 acts essentially like a diode. Thus, a certain base-emitter bias voltage will be established between the node 28 and the $V_{EE}$ rail 30.

Because I1 is fixed at a given value during the high-power mode of operation, the voltage at node 28 is fixed. This fixed voltage is applied to the bases of the transistors Q7–Q9. If the transistors Q7–Q9 are matched to Q6, then each of these transistors, Q7–Q9, will have a collector current which is identical to the current I1. These collector currents I2, I5 and I6 can be altered from the collector current I1 by changing the geometries of the transistors Q7–Q9 with respect to the geometry of transistor Q6, as will be appreciated by those skilled in the art. Since the preferred form of the invention is as an integrated circuit, matching between transistors Q7, Q8 and Q9 and between transistors M1, M2 and M3 can be easily accomplished because of the proximity of these transistors to each other on the integrated circuit die.

Because the base drive of the transistors Q7–Q9 is fixed by the level of the current I1, the transistors Q7–Q9 act as current sources and tend to maintain their collector currents constant under all conditions. That assumes, however, that I1 does not change.

The current I2 is shared by the switching transistors Q1–Q3 because these transistors have a shared emitter node. Thus, they compete for the current I2. When either the transistor Q1 or Q2 is turned on, the current I2 will be primarily taken as the collector current of the transistor Q1 or Q2 that is turned on. This leaves Q3 with a very small emitter current and, therefore, a very small collector current. This tends to cause the voltage at node 16 to rise because of the smaller voltage drop across the channel of the transistor M3. This lower voltage drop raises the voltage on node 16 toward $V_{CC}$. The high voltage on node 16 turns transistor Q5 on, thereby causing the $V_{o2}$ output voltage to rise because of the attempt by the transistor Q5 to force more current to flow through the current source Q9. Conversely, if neither transistor Q1 nor Q2 is turned on by the voltages applied at nodes 20 and 22, then the transistor Q3 will supply most or all of the emitter current I2. This causes Q1 and Q2 to have very small collector currents. When a small collector current is flowing through the channel of transistor M2 and the diode D1, the voltage drop from the $V_{CC}$ rail 18 to the node 14 is very small. This means that the node 14 will be approximately equal to the voltage on the $V_{CC}$ rail 18. On the other hand, the collector current of Q3 will be relatively large, thereby causing an increased voltage drop across the diode D2 and the channel of the transistor M3. Thus the voltage at the node 16 will be lower than the voltage at the node 14. The high voltage at node 14 causes the transistor Q4 to attempt to drive more current through the current source Q8, thereby forcing the output signal voltage Vo1 on node 24 to rise. The low voltage on node 16 will cause the Vo2 voltage on node 26 to be low.

The presence of the clamping diodes D1 and D2 tends to stabilize the voltages at the nodes 14 and 16 such that these voltages vary only slightly for variations in the collector currents I3 and I4. The beneficial effect of limiting the voltage swing on the nodes 14 and 16 is that it speeds up operation of the gate because the parasitic capacitances associated with each of the output nodes do not have to be charged or discharged as much as if the voltage swings on these nodes were larger.

The presence of the clamp diodes D1 and D2 also tends to prevent saturation of the transistors Q1–Q3 in the event of rising temperatures. That is, if the input voltages on the nodes 20, 22, and 23 are dependent upon circuits having thermal characteristics such that the voltages on these nodes increase with increasing temperatures, then the presence of the diodes D1 and D2 is desirable to help prevent saturation of any of the transistors Q1–Q3. Saturation of a bipolar transistor occurs when the base voltage rises above the collector voltage, thereby forward biasing the base-collector junction (assuming an NPN transistor—vice versa for PNP). Because the voltage drop across a diode junction decreases with increasing temperature, the voltages on nodes 14 and 16 will increase with increasing temperatures all other conditions being the same. Thus the voltages on nodes 14 and 16 rise with increasing temperatures. Thus, if the voltages on the bases of transistors Q1–Q3 are increasing with increasing temperature due to the temperature characteristics of the circuits supplying input voltages to the nodes 20, 22, and 23, then this rise of base voltage on these transistors will be compensated by the corresponding rise of the collector voltages on the nodes 14 and 16. This tends to prevent the transistors Q1–Q3 from going into saturation inadvertently because of increasing temperature.

There are two disadvantages to having diodes D1 and D2 present that must be weighed against the advantages of having these diodes present. First, the temperature dependence of the diodes D1 and D2 causes the logic swing to be smaller with increasing temperature with the same rate of change as the junction drop across one forward biased diode. The reason for this is that, for a constant value of current through the diodes D1 and D2, the junction voltage drop across these diodes decreases at a rate of $-1.5$ mV/degree C. Thus, if either Q1 or Q2 is drawing a high current level so as to maintain the collector node 14 at the low-logic level and this current is maintained constant for increasing temperature, then the resulting decrease in drop across the diode D1 will cause the low logic level on node 14 to increase at the rate of 1.5 mV/degree C. As for the output node 24, two diode drops come into play, i.e., the diode drop across D1 and the diode drop across the base-emitter jucntion of Q4 which is also dropping. The result is that the low voltage level of the logic swing rises as the function of the sum of the decreases in the junction drop across two forward biased diodes.

The fact that the logic swing decreases with increasing temperature tends to degrade the noise margin of the circuit. Therefore, the decreasing noise margin with increasing temperature is not a severe drawback.

A drawback of the presence of the diodes D1 and D2 is that the junction capacitances of the diodes adds to the total parasitic capacitance affecting the output nodes 14 and 16. However the slight loss in speed is made up for by the large gain in power savings allowed by use of the invention. Further, the presence of the diodes D1 and D2 causes a dead band in the sense that the two outputs do not move simultaneously toward their new states when the input signal changes. Instead, one output begins to change immediately while the other does not move immediately. This characteristic is due to the non-linearity of the composite load comprised of the diode in parallel with the MOS transistor, and is useful in certain circumstances.

The presence of the diodes D1 and D2 tends to render the voltages on the nodes 14 and 16 somewhat less dependent upon matching of current source and current sink capacities thereby rendering these voltages more predictable. If the diodes D1 and D2 were not present, then the voltage swings on the nodes 14 and 16 would depend more heavily upon the matching between the magnitude of the current supplied to the nodes 14 and 16 through the channels of the MOS transistors M2 and M3, and the collector currents I3 and I4 drawn out of the nodes 14 and 16 by the transistors Q1–Q3. That is, if the transistor Q1 is driven in such a way as to draw more current out of the node 14 than is supplied through the channel of the transistor M2, and there is no diode D1 to supply extra current to make up the difference, then the voltage across M2 would have to increase thereby possibly saturating Q1 or Q2.

SWITCHING TO THE LOW POWER MODE

When the ECL gate is switched to the low-power mode, the MODE signal from the bus 12 causes the transistors M2 and M3 and the current mirror load transistor M1 to switch to their high impedance states. If the node 14 is in the logic low state prior to switching to the low-power mode, it must be maintained in that logic low state after switching to the low-power mode. Because this mode causes the impedance of M1 to increase substantially, the bias current I1 becomes substantially less. The result in that the base-emitter voltage of the transistor Q6 relaxes to the level to support the new level for I1. This causes the other bias currents I2, I5 and I6 to assume new lower levels as a function of the new lower level of base-emitter voltage between nodes 28 and 30. As a result of the lower value of current I2, the transistors Q1 and Q2 will be drawing some lesser amount of current I3 out of the node 14. To maintain node 14 at the logic low level, the MOS transistor must assume a higher impedance which causes the voltage drop across the channel of the transistor M1 to be substantially the same at the new lower level of the current I3 as existed across the channel when I3 had a higher value. The function of the MODE signal is to cause all the MOS transistors to assume their higher impedance states for the low power mode to cut the bias current to lower levels and, simultaneously, to preserve the logic state of the gate.

The advantages of having clamping diodes D1 and D2 present to render the voltages on the nodes 14 and 16 more predictable can also be obtained in another manner. This is done by eliminating the diodes D1 and D2 and designing the MOS transistors M2 and M3 in matched relationship with the transistor M1 such that the current supplied to the output nodes 14 and 16 through the transistors M2 and M3 will match the currents I3 and I4 drawn out of these nodes by the transistors Q1-Q3. To expand on this concept, because of the operation of the current mirror, the current density in the collector of Q7 will be equal to the current density in the collector of Q6. Because I1 can be controlled by the design of the transistor M1 and by application of a suitable MODE control signal, I2 can be controlled to be equal to I1 if the physical dimensions of transistors Q6 and Q7 are equal. Because I2 will be known, the collector currents I3 and I4 will be known for given states of the input voltages on the nodes 20, 22, and 23. Therefore, the MOS transistors M2 and M3 can be designed relative to the design of the transistor M1 so as to match the current supplied through these transistors to output nodes 14 and 16 to the currents drawn out of these nodes by the transistors Q1-Q3. Of course, by Kirchoff's current law, the current flowing into the nodes 14 and 16 is always going to equal to the current flowing out of these nodes. By proper matching of the transistors M2 and M3 to the characteristics of the transistor M1, relatively precise matching can be obtained, and the diodes D1 and D2 can be omitted.

The main reason for having the clamp diodes D1 and D2 present is the difficulty in exactly controlling the resistance of the MOS transistor channels. Many variations in the doping of the MOS transistor structures and in the control of the MODE control signal can occur. These variations cause a certain degree of unpredictability in the channel resistance of transistors M2 and M3 in the low and high power modes. Because these resistances cannot be controlled precisely, precise matching of the current source capability of the MOS transistors compared to the current sink capability of the bipolar switching transistors of the ECL gate becomes difficult. The presence of the clamp diodes D1 and D2 substantially reduces the need for exact matching of the current source capability to the current sink capability.

To make use of the clamping effect of the diodes, the MOS transistors M2 and M3 should be sized relative to M2 such that the channel currents through M2 and M3 are less than I2 such that the diodes D1 and D2 are operating in their 60 millivolt/decade regions when the input is in the appropriate logic state to cause a low output. The extra current needed to match the current into the output nodes 14 and 16 to the current out of these nodes is then supplied through the diodes and they are biased in the proper regions of their I-V curves to properly control the voltage on the nodes 14 and 16. In such a case, the current supplied through the channel of the MOS transistors, for example $I_{M2}$ in the case of node 14, plus the current supplied through the diode, $I_D$, will match the collector current I3 of the transistors Q1 and Q2.

Figure 2:
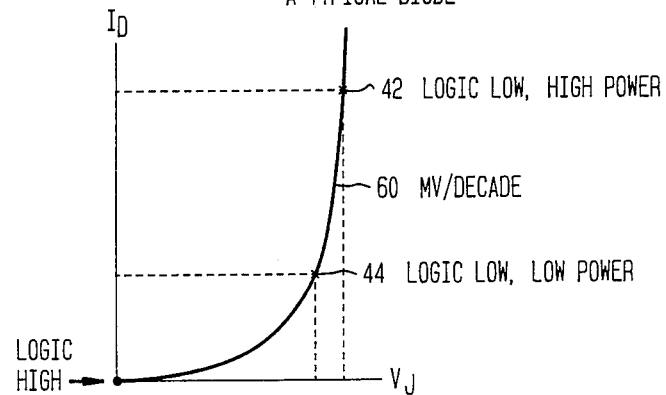
FIG. 2 is an I-V characteristic curve of a typical diode.

As can be seen from inspection of FIG. 2, the current through the diode $I_D$ can change by a large amount on certain portions of the diode characteristic curve without substantially changing the junction voltage drop across the diode junction. For example, very little change in the junction drop occurs for large changes in the current through the diode for the area between points 42 and 44 in FIG. 2. Thus, the voltage on nodes 14 and 16 may be more precisely controlled by constructing and biasing the circuit such that the current through the diodes D1 and D2 stays within the 60 millivolt/decade portion of the diode characteristic curve.

In the preferred embodiment, the transistors M1 through M3 are P-channel MOS devices. However, in other embodiments, the transistors M1-M3 could be N-channel devices. Where N-channel devices are used, there are certain advantages and disadvantages. P-channel devices have the advantage that their majority carries are holes and their sources are positive with respect to their drains. Thus their sources are connected to the $V_{CC}$ rail 18. This means that the gate to source voltage required to turn on the transistors M1-M3 is determinate in that $V_{CC}$ is fixed and the threshold of the device is fixed so the gate to source voltage to turn the transistor on and off will always be known. However, P-channel devices can supply less current per unit area than N-channel devices. In fact, P-channel devices have to be approximately twice as large as N-channel devices to supply the same current for a given gate to source voltage and a given threshold value. Thus, if chip area is to be conserved in the system in which the invention is being used, then is preferable to use NMOS devices for the transistors M1-M3, since they can be made much smaller for a given current source capability.

The disadvantage of using NMOS devices is that, in NMOS, electrons are the majority carriers, and, therefore, the source of the N-channel devices must be connected to the output nodes 14 and 16. Because the voltage on the output nodes 14 and 16 is not fixed, and can be indeterminate if the clamp diodes D1 and D2 are not present and matching is not precisely performed, the gate-to-source voltage needed to control the resistance of the channels of NMOS versions of M2 and M3 is also somewhat uncertain. If NMOS devices are to be used for M1-M3, then their channels will be doped such that the transistors are in the low-impedance state and current flows therethrough when the gate-to-source voltage is zero. To force the circuit into the low-power state, the transistors M1 and M3 must have their gate-to-source voltages driven negative to reduce current flow through the channels of the transistors M1-M3. NMOS devices could be used if the MODE control signal on bus 12 is driven sufficiently negative to always be able to turn off transistors M1-M3 when the low-power mode is desired for any voltage which may exist on the nodes 14 and 16.

NMOS devices are also preferred where speed is the primary concern in the system design. That is, for a given chip area devoted to the NMOS devices M1-M3, more current could be supplied if these devices were N-channel than if they were P-channel. Higher currents means faster operating speed.

ADVANTAGES OF THE INVENTION

The principal advantage of the invention is that it can change the position on the speed/power curve traditionally used to measure the performance of logic. That is, an ECL gate using the invention may operate at a very low power point on the curve when no actual switching is being performed and may be shifted to a high-power, high-speed position on the curve when switching is to be done. The total effect is to have an ECL gate which switches as fast as other high power ECL gates while having an average power dissipation which is substantially lower. The overall power savings can be quite dramatic, with very little sacrifice in operating speed. There is some slight sacrifice in operating speed associated with the invention, because parasitic capacitances associated with the MOS transistors and clamping diodes are coupled to the output node. These parasitic capacitances typically can cause a slowing down of switching speed by approximately 50 picoseconds.

This penalty is more than offset by the power saving, however. Typically in memory system design, a power budget will be imposed upon the designer. The designer will then be forced to select an operating point on the speed/power curve which will keep him within the power budget, and he must be satisfied with the speed which will be inherent in operating at that power level. With the use of the invention, the designer may pick the speed at which he wishes to operate, and then he may select a low power level at which to operate by properly sizing and doping the MOS transistors M1–M3. Because he can make the low-power state extremely low, the designer will be able to get the operating speed he desires while easily staying within the power budget for the system.

As an example of the savings which may be obtained using the invention, suppose the invention is used as a decoder for driving the word lines or bit lines in a large memory. Typically, a large memory will involve 256 or 512 such decoders. Suppose also that the designer wants to operate at 200 picoseconds gate delay. To obtain this gate delay, the gate must operate at 200 microamps. Suppose, also, that the power budget of the system forces each gate to operate at 50 microamps. This would cause the gate delay for the gates operating at this power level to be 800 picoseconds, or four times as long as the designer desires. If the invention were used, the power budget could be met, and the gate delay would be only 250 picoseconds. Of course, the savings would be even greater if the system were larger such that more gates were used, or if the system had a stricter power budget.

Figure 3:
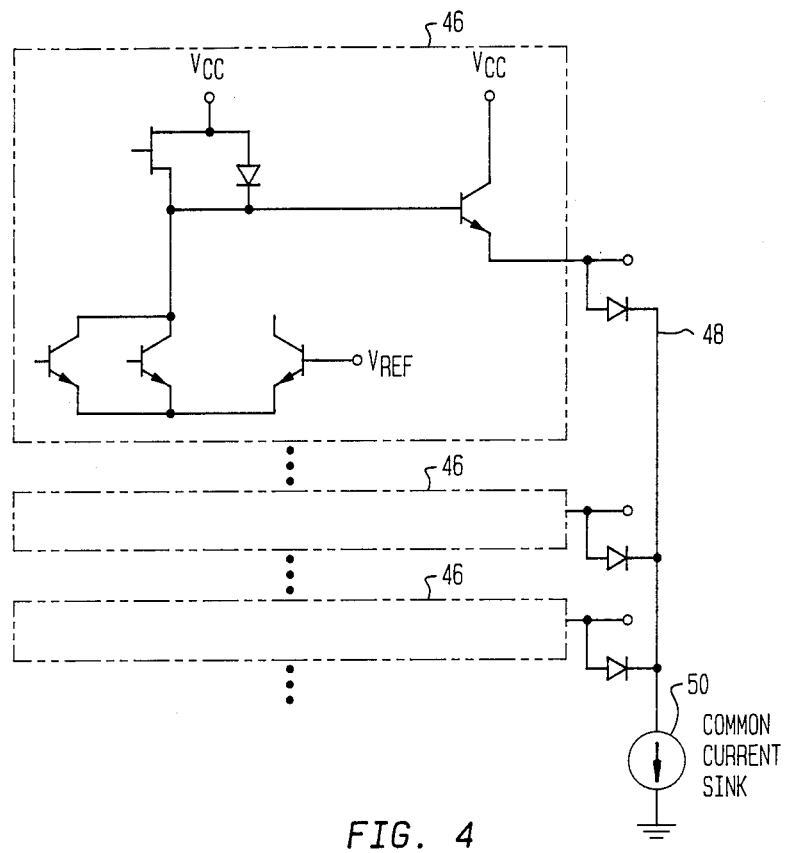
FIG. 3 is circuit showing how the invention may be used.

FIG. 3 shows an example of a typical application of the invention. A collection of gates 46 together comprise a decoder for driving a bit line or a word line 48 in a memory circuit. The bit line or word line is connected to a common current sink 50, which is designed to sink output current from only one gate in the collection of gates which comprise the decoder. This common current sink is conventionally used to recover from a high logic to a low logic level. Recovery from the high to the low level is performed by the common current sink 50 drawing current out of the parasitic capacitance associated with each output load capacitance $C_L$ and with line 48 caused by this line being connected to the outputs of a plurality of decoders. Normally only one of the gates in a decoder is high at any given time. If the gates in the decoder are conventional in design and do not use the switchable loading impedance of the invention, then if the power is cut off to these conventional gates, both their true and complement outputs will go to a logic high state. Not only does this fail to preserve the logic states existing before the transition from the high power to the low-power state, but it also swamps the common current sink 50. When the high-power mode is restored to all of the gates 46 of the decoder (if they are prior art gates), the common current sink 50 will have to sink output current from the parasitic capacitance of all of the gates, as opposed to just one gate, to recover from the high to the low level. Thus, if there are ten such gates, recovery from the high to the low level will take 10 times as long as if the invention is used.

Figure 4:
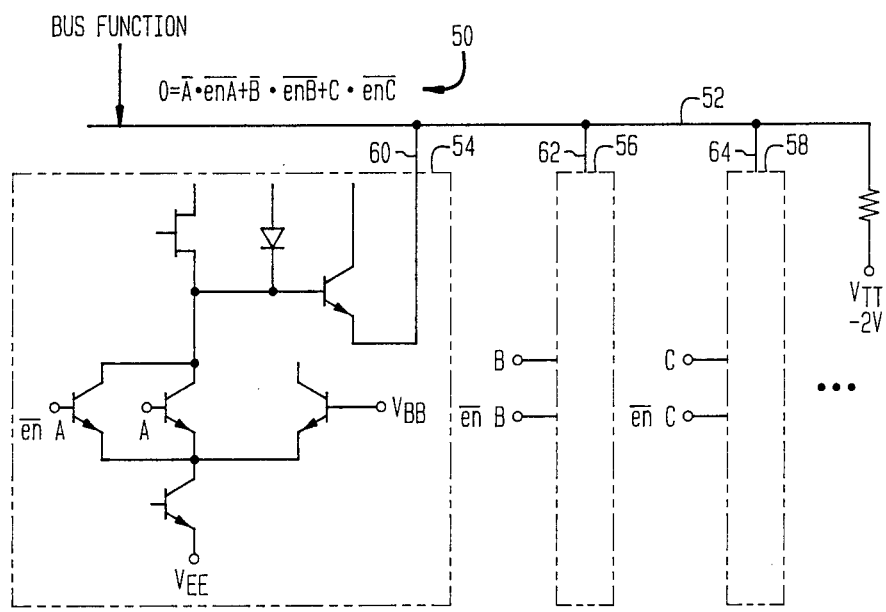
FIG. 4 is another circuit showing how the invention may be used.

FIG. 4 shows another application where the invention is useful. In FIG. 4, a plurality of gates which implement the terms of the Boolean expression shown at 50 are OR-tied to a common bus 52. That is, the gate 54 supplies the logic term A' (not A) ANDed with the ENABLE A' signal. The gate 56 supplies the second term in the expression 50, and the gate 58 supplies the third term in the expression 50. In the situation of interest, only one of these terms will be active at any given time. Thus, when the first term is active, the line 60 will be high and the lines 62 and 64 will be low. If the gates 54, 56, and 58 are conventional, then the gates 56 and 58 must be maintained in their high-power states such that they will maintain their lines 62 and 64 at logic low levels to prevent them from taking control of the bus and causing the bus 52 to carry a signal which is not a true reflection of the input signals represented in the expression 50. That is, the bus 52 will no longer carry a signal which is representative of the expression shown at 50. However, using the invention, the gates 56 and 58 may be powered down to their low-power states, and the lines 62 and 64 will remain low. Thus, bus 52 carries a signal defined by the Boolean expression at 50 while power is saved in gates 56 and 58.

Use of the invention will not precisely preserve the voltages on the output nodes of the gates as they existed in the high-power mode. If a particular output was a logic low in the high-power state, this logic low level will be increased by about 120 millivolts when the gate is powered down. Likewise, if a particular output was a logic high level in the high-power mode, its voltage will increase about 60 millivolts when the gate is powered down. However, these slight changes are not enough to alter the operation of a system using the invention, as would otherwise be the case if conventional gates were used and the power-down operation changed the logic levels in the system.

Although the invention has been described in terms of the preferred embodiment and alternative embodiments detailed above, those skilled in the art will appreciate many variations which may be incorporated without departing from the true spirit and scope of the invention. All such variations are intended to be included within the scope of the claims appended hereto.

What is claimed is:

1. An apparatus for changing the power dissipation of an emitter coupled logic gate having at least two bipolar switching transistors having a common emitter terminal between high and low power modes while substantially preserving the logic output voltages comprising:

a mode control bus for receiving a mode control signal;

means coupled to said emitter coupled logic gate and said mode control bus for establishing the bias current through all said bipolar switching transistors at either of a high or a low bias current level in response to said mode control signal; and load impedance means coupled to said mode control bus and said emitter coupled logic gate, for switching, in response to said mode control signal, from a first level of impedance while said emitter coupled logic gate is operating at said high bias current level to a second higher impedance level when said emitter coupled logic operating at said low bias current level.

2. The apparatus of claim 1 wherein said means for establishing the bias current is an MOS transistor having its gate coupled to said mode control bus for receiving said mode control signal and a current mirror having a bias current input terminal and having a common emitter current output terminal coupled to said common emitter terminal of said emitter coupled logic gate, wherein said MOS transistor has its source and drain terminals coupled between a power terminal for coupling to a source of D.C. bias voltage and said bias current input terminal of said current mirror.

3. The apparatus of claim 2 wherein said MOS transistor is PMOS.

4. The apparatus of claim 2 wherein said MOS transistor is NMOS.

5. The apparatus of claim 2 wherein said load impedance means is comprised of at least two MOS transistors having their sources and drains coupled to said emitter coupled logic gate and said mode control bus such that the collector current for each of said bipolar switching transistors in said emitter coupled logic gate flows through one of said MOS transistors, said mode control bus being coupled to the gates of said MOS transistors in both load impedance means and said means for establishing the bias current.

6. The apparatus of claim 5 wherein said MOS transistors in said means for switching are PMOS.

7. The apparatus of claim 5 wherein said MOS transistors in said means for switching are NMOS.

8. The aparatus of claim 5 further comprising clamping diode means coupled to the source and drain terminals of each said MOS transistor in said load impedance means in such a manner as to provide an additional path through which collector current can flow into said bipolar switching transistors.

9. The apparatus of claim 5 further comprising means for clamping the voltages on the collectors of said bipolar switching transistors to a predetermined range of voltage.

10. The apparatus of claim 8 wherein the MOS transistors in said means for establishing and in said means for switching are sized and have doping and threshold levels such that the MOS transistors in said means for switching supply less current than said bipolar collector current by an amount of current which will cause said diodes to operate in their 60 millivolt/decade region.

11. An apparatus for providing selectable power dissipation levels for a logic gate comprising:

a first MOS transistor having its source and drain nodes coupled between a power supply input for supplying power to said logic gate and the D.C. voltage input node of said logic gate, said MOS transistor having a gate for coupling to a line carrying a mode control signal, said mode control signal for causing said MOS transistor to switch between a high and a low impedance state;

a current mirror for providing a regulated flow of bias current through said logic gate; and a second MOS transistor coupled to said current mirror by having said second MOS transistor source and drain terminals coupled between a power supply terminal for said current mirror and the D.C. voltage input node in said current mirror, and having a gate for coupling to said mode control signal.

12. A method of operating an emitter coupled logic circuit having two bipolar transistors having bases, emitters and collectors and coupled to share a common emitter bias current flowing in a shared emitter line to a reference potential so as to switch said emitter coupled logic circuit between a high power dissipation, high speed switching mode and a low power, idle mode comprising the steps of:

switching the common emitter bias current shared by the bipolar transistors between a first current level and a second, lower current level; and simultaneously switching the load impedances for said bipolar transistors from a first impedance state while operating at said first current level to a second higher impedance state while operating at said second lower current level so as to leave the collector to reference potential voltage difference substantially unchanged in either mode of operation.

13. The method of claim 12 wherein said step of switching the bias current between said first and second current levels is implemented by applying a mode control signal to the gate of an MOS transistor the channel of which conducts and controls the collector current level of a bipolar transistor of a current mirror where said current mirror controls the level of the shared emitter current and causing said mode control signal to assume at least two levels one of which is to cause said first level of current to flow and the other of which is to cause said second, lower level of emitter bias current to flow.

14. The method of claim 13 wherein said step of switching the load impedance includes the step of applying the same mode control signal used to switch the bias current between said first and second levels to the gates of the MOS transistors through which the collector current of the bipolar switching transistors flow to cause the MOS transistors to switch between first and second impedance levels.

* * * * *